(12) United States Patent
Kusnadi et al.

(10) Patent No.: US 8,260,997 B1
(45) Date of Patent: Sep. 4, 2012

(54) MAGNETIC SWITCH FOR AUTOMATIC NETWORK TRAFFIC SHUTDOWN WHILE UNLOCKING NETWORK LINE CARD

(75) Inventors: Frans Kusnadi, San Jose, CA (US); Jimmy Che-Kin Leung, Fremont, CA (US); Mandy Hin Lam, Fremont, CA (US)

(73) Assignee: Cisco Technology, Inc., San Jose, CA (US)

( * ) Notice: Subject to any disclaimer, the term of this patent is extended or adjusted under 35 U.S.C. 154(b) by 182 days.

(21) Appl. No.: 12/269,546

(22) Filed: Nov. 12, 2008

(51) Int. Cl.
*G06F 13/00* (2006.01)
*G06F 13/32* (2006.01)

(52) U.S. Cl. .................. 710/302; 710/300; 710/301

(58) Field of Classification Search .......... 710/300–302
See application file for complete search history.

(56) References Cited

U.S. PATENT DOCUMENTS

| 7,519,842 B2* | 4/2009 | Chen et al. ............ 713/310 |
| 7,685,443 B2* | 3/2010 | Chheda et al. .......... 713/320 |
| 2003/0091267 A1* | 5/2003 | Alvarez et al. ......... 385/16 |

OTHER PUBLICATIONS

Wikipedia, "Reed switch", [online], Sep. 27, 2008, [retrieved on Oct. 17, 2008]. Retrieved from the internet: <URL: http://en.wikipedia.org/w/index.php?title=Reed_switch&printable=yes>, pp. 1-4.

* cited by examiner

*Primary Examiner* — Mark Rinehart
*Assistant Examiner* — Jeremy S Cerullo
(74) *Attorney, Agent, or Firm* — Leon R. Turkevich

(57) ABSTRACT

In one embodiment, a method comprises initiating shutdown of network traffic of a line card while the line card is coupled to a connector chassis and exchanging network traffic, the initiating shutdown in response to actuation of a magnetic switch associated with the line card, the magnetic switch being actuated in response to movement of actuating structure that unlocks the line card for removal from the connector chassis; and completing the shutdown of network traffic in the line card prior to permitting complete removal of the line card from the connector chassis.

21 Claims, 6 Drawing Sheets

MAGNETIC SWITCH FOR AUTOMATIC NETWORK TRAFFIC SHUTDOWN WHILE UNLOCKING NETWORK LINE CARD

TECHNICAL FIELD

The present disclosure generally relates to network line cards that interface with a connector chassis for transmission of data across the network line card and another apparatus coupled to the connector chassis.

BACKGROUND

Telecommunications equipment can include a connector chassis and multiple line cards that are connected to the connector chassis. Each line card can be configured to perform a corresponding operation according to prescribed customer specifications. For example, one line card can be implemented as a network router device having a wide area network interface circuit connector, another as a firewall device, another as a local area network switch, another as a line interface having one or more network interface circuit connectors (e.g., 100-Base T, 1000-Base T, ATM OC-3, etc.).

A particular concern of using a connector chassis with multiple line cards involves enabling the removal of a line card from the connector chassis without affecting operations of the other line cards connected to the connector chassis. A particular concern is the ability to shut down network traffic on the line card before removal of the line card: a failure to shut down network traffic on the line card before removal from the connector chassis can cause a failure in other hardware devices (or software programs executed on the hardware devices) that expect the continued availability of the network traffic from the line card. One attempt to detect removal of the line card relied on long and short sense pins installed on the line card, where during removal of the line card the short sense pin (having a length of about 1 to 2 mm) would be disconnected from the connector chassis before the long sense pin (having a length of about 3 mm): network traffic shutdown on the line card would be initiated in response to the line card detecting the disconnect of the short sense pin from the connector chassis. However, the time interval between the disconnect of the short sense pin and the long sense pin was dependent upon the speed at which the user removes the line card: hence, the failure to shut down network traffic on the line card before removal still could occur if the user removed the line card too quickly.

BRIEF DESCRIPTION OF THE DRAWINGS

Reference is made to the attached drawings, wherein elements having the same reference numeral designations represent like elements throughout and wherein.

DESCRIPTION OF EXAMPLE EMBODIMENTS

OVERVIEW

In one embodiment, a method comprises initiating shutdown of network traffic of a line card while the line card is coupled to a connector chassis and exchanging network traffic, the initiating shutdown in response to actuation of a magnetic switch associated with the line card, the magnetic switch being actuated in response to movement of actuating structure that unlocks the line card for removal from the connector chassis; and completing the shutdown of network traffic in the line card prior to permitting complete removal of the line card from the connector chassis.

In another embodiment, an apparatus comprises actuating structure and a magnetic switch. The actuating structure is constructed and arranged for movement that unlocks a line card for removal from a connector chassis. The line card exchanges network traffic while coupled to the connector chassis. The magnetic switch is constructed and arranged for initiating shutdown of network traffic of the line card in response to the movement of the actuating structure. The actuating structure further is constructed and arranged to enable the line card to complete the shutdown of network traffic prior to the actuating structure permitting complete removal of the line card from the connector chassis.

DETAILED DESCRIPTION

Particular embodiments employ a magnetic switch to initiate shutdown of network traffic of a line card in response to movement of actuating structure. The magnetic switch causes a transition in an output of a magnetic field that is detected by structure associated with the line card (e.g., a magnetically sensitive reed switch), resulting in a change in an electrical state by the structure. Network traffic shutdown circuitry in the line card executes and completes the shutdown of network traffic of the line card in response to the change in electrical state created by the structure detecting the transition in the magnetic field.

The particular embodiments also ensure that the shutdown of network traffic is completed prior to the actuating structure permitting the complete removal of the line card from the connector chassis. Hence, a line card can be removed in a reliable manner from a connector chassis in a manner that ensures that network traffic on the line card to shutdown before removal from the connector chassis.

Figure 1:
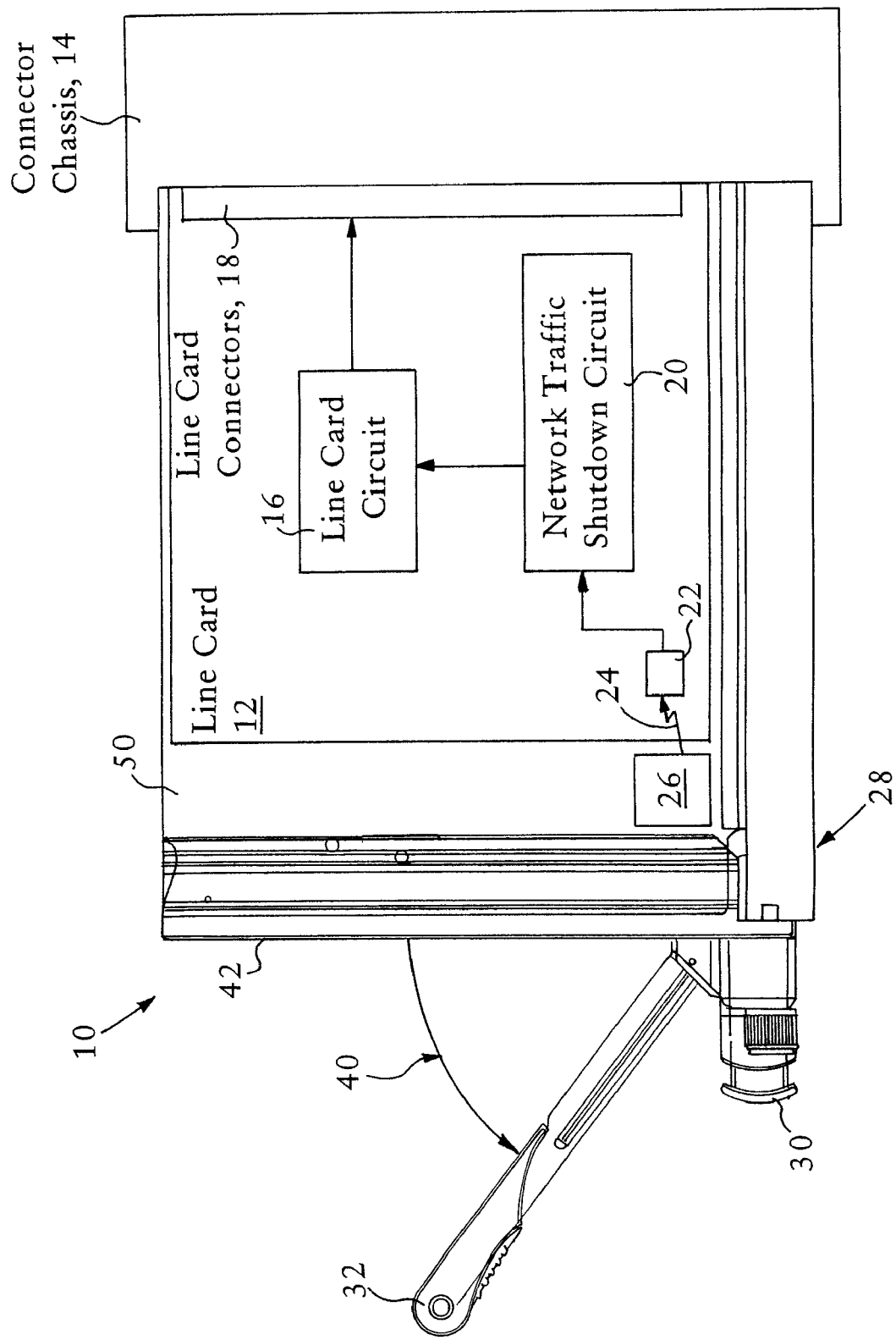
FIG. 1 illustrates an example assembly having a magnetic switch and actuating structure constructed and arranged for unlocking a line card for removal from a connector chassis while simultaneously initiating shutdown of network traffic in response to movement of the actuating structure, according to an example embodiment.

FIG. 1 summarizes an example assembly 10, according to an example embodiment. The assembly can include a line card 12 and a connector chassis 14. The line card 12 can include a line card circuit 16, line card connectors 18 for establishing electrical connections with the connector chassis 14 (e.g., for exchanging network traffic), and a network traffic shutdown circuit 20. The line card circuit 16 is constructed and arranged for exchanging network traffic with other line cards (not shown) while coupled via the line card connectors 18 to the connector chassis 14. The assembly 10 also can include a structure 22 associated with the line card 12, a magnetic switch 26, and an actuating structure 28.

The line card 12, the structure 22, the magnetic switch 26, and the actuating structure 28 can be mounted on a line card assembly 50. In one example embodiment, the line card assembly 50 can be removed from the connector chassis 14 after a removal arm 32 of the actuating structure 28 has been moved to a second (fully extended) position 40, causing the removal of the line card 12, the structure 22, the magnetic switch 26 and the actuating structure 28 as a unit from the connector chassis 14; in this example embodiment, the magnetic switch 26 and the actuating structure 28 can be considered mounted "on" the line card 12 based on the removal of the line card assembly 50 as a unit. In another embodiment, the line card assembly 50 can be considered part of the connector chassis 14, such that only the line card 12 and the structure 22 are removed from the connector chassis 14 and the line card assembly 50 after the removal arm 32 has been moved to the second (fully extended) position 40. The structure 22 also can be mounted on the line card assembly 50 and distinct from the line card 12, if preferred.

The structure 22 is associated with the line card 12 (at least electrically), and is constructed and arranged for detecting a transition in the output of a magnetic field 24 from the magnetic switch 26. As used herein, a transition in the output of the magnetic field 24 refers to the magnetic switch 26 either initiating supply of the magnetic field 24 above a first prescribed magnetic flux value that causes a transition in the structure 22, or the magnetic switch 26 halting supply of the magnetic field 24 from the first prescribed magnetic flux value to below a second prescribed magnetic flux value that causes another transition in the structure 22. The magnetic switch 26 is described in further detail below with respect to FIG. 2.

Hence, a transition in the output of the magnetic field 24 from the magnetic switch 26 causes the structure 22 to detect the transition in the output of the magnetic field 24 and in response electrically transmit the transition (e.g., from "OFF" to "ON" or vice versa) to the network traffic shutdown circuit 20 to initiate the shutdown of network traffic. In one example embodiment, the structure 22 can be implemented as a reed switch that is mounted on the line card 12 and responsive to the magnetic field 24. The network traffic shutdown circuit 20, in response to detecting the transition applied by the structure 22, executes a prescribed shutdown of network traffic in the line card circuit 16. Upon completion of the shutdown of network traffic by the network traffic shutdown circuit 20, the line card 12 can be safely removed from the connector chassis 14 without adversely affecting any other line card connected to the connector chassis.

The actuating structure 28, also referred to as an ejector assembly, is constructed and arranged for movement that unlocks the line card 12 for removal from the connector chassis 14. As described in further detail below with respect to FIGS. 2-6, the magnetic switch 26 is constructed and arranged for initiating shutdown of network traffic based on creating the transition in the output of the magnetic field 24 in response to movement 36 of the actuating structure 28.

Figure 2:
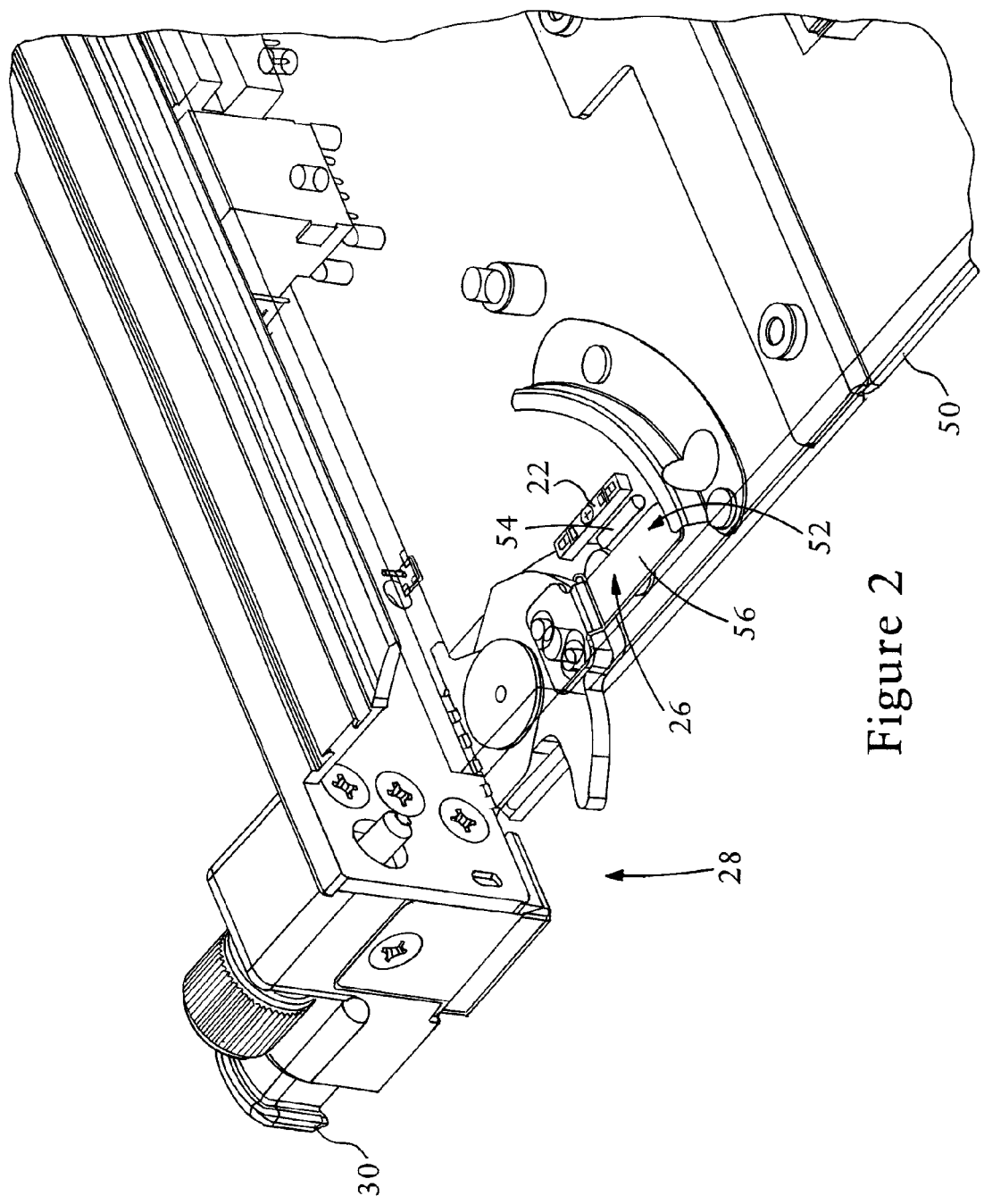
FIG. 2 illustrates a perspective view of the actuating structure and magnetic switch in a first position enabling the line card to exchange network traffic while connected to the connector chassis, according to an example embodiment.
Figure 3:
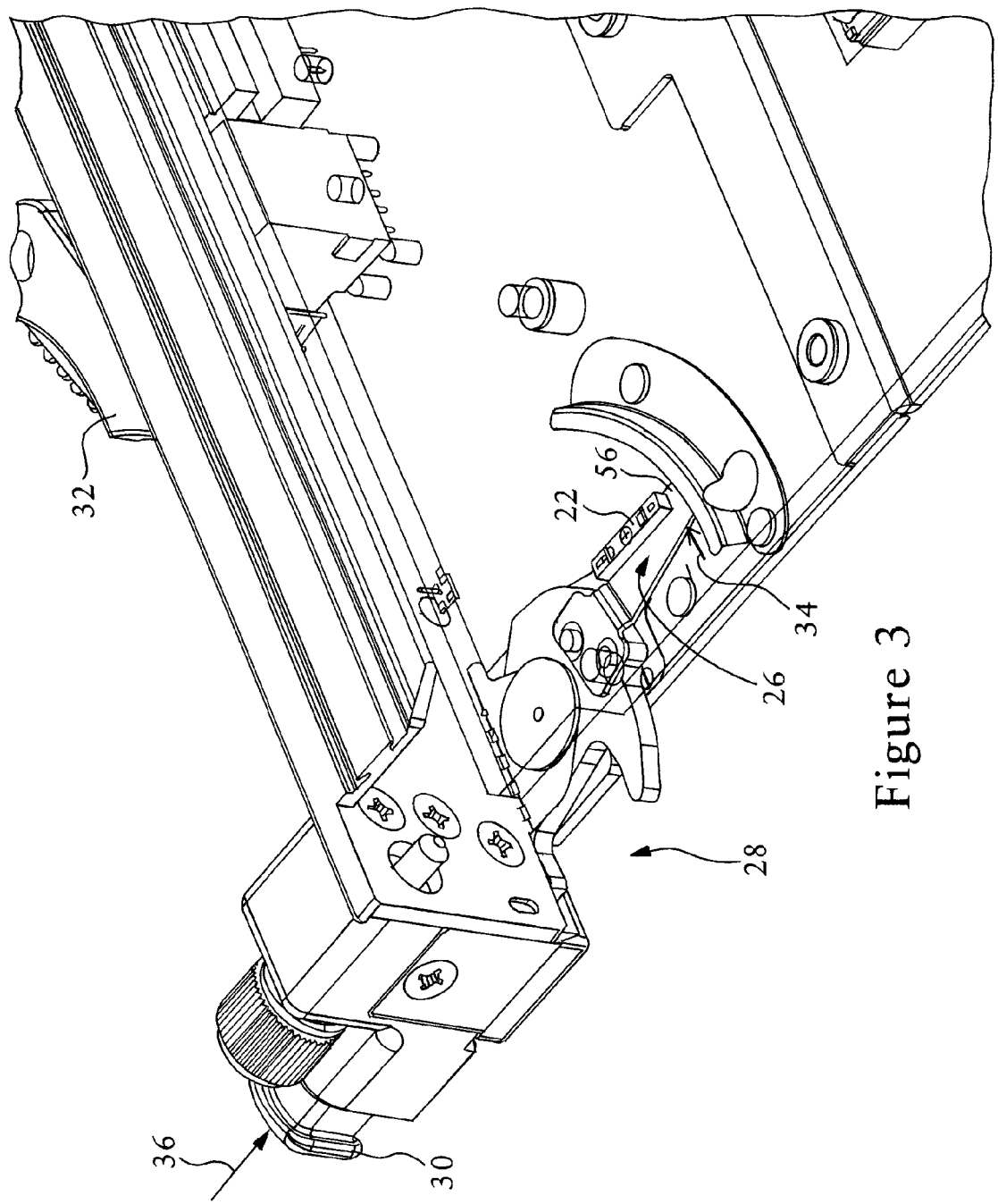
FIG. 3 illustrates a perspective view of the actuating structure and actuation of the magnetic switch in a second position for initiating shutdown of network traffic of the line card, according to an example embodiment.
Figure 4:
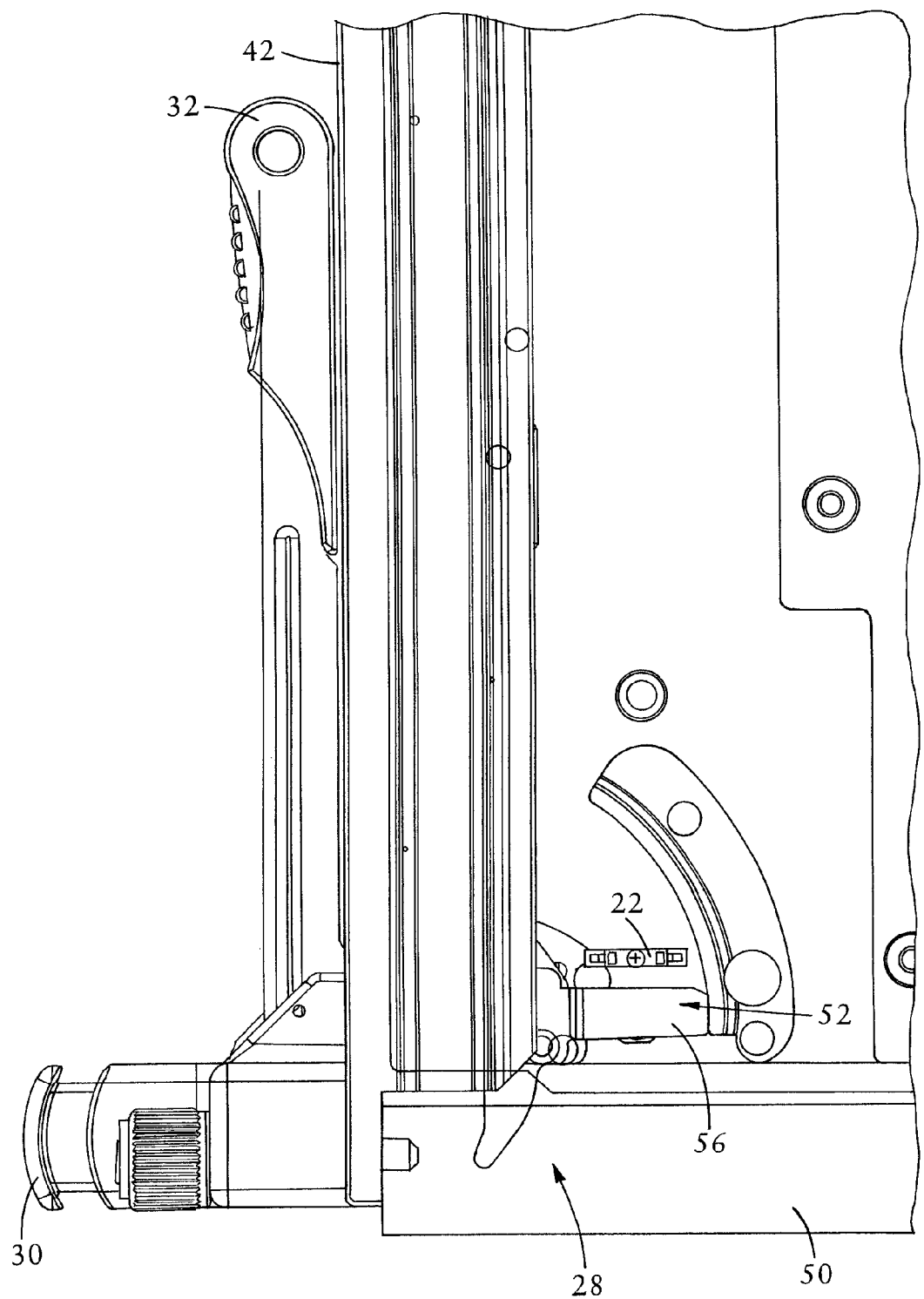
FIG. 4 is a top view of the actuating structure and magnetic switch in the first position of FIG. 2.
Figure 5:
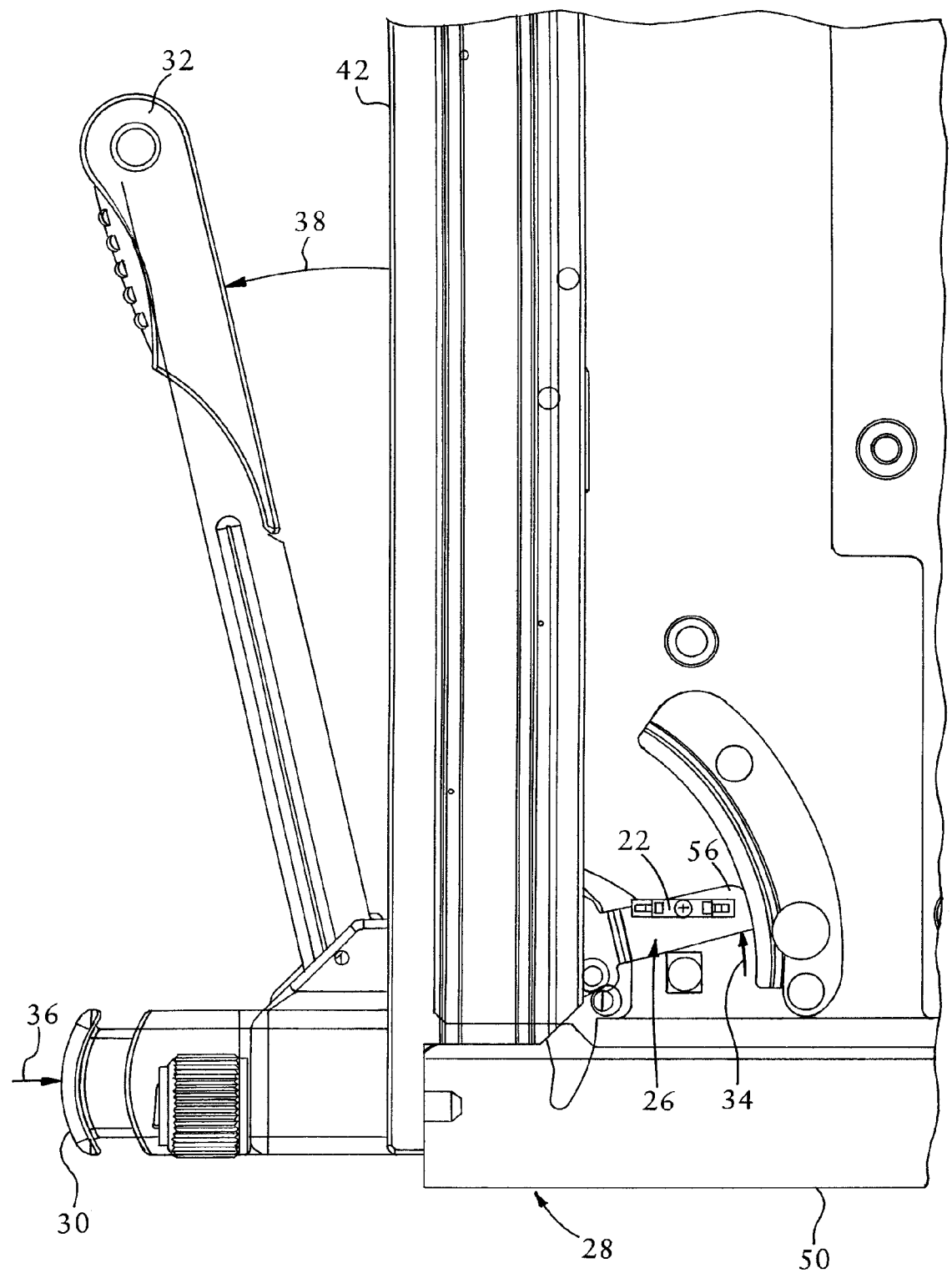
FIG. 5 is a top view of the actuating structure and magnetic switch in the second position of FIG. 3.

FIGS. 2 and 3 are perspective views of the line card assembly 50, including the structure 22, the magnetic switch 26, and the actuating structure 28, according to an example embodiment. FIGS. 4 and 5 are top views of the line card assembly 50, including the structure 22, the magnetic switch 26, and the actuating structure 28, according to an example embodiment. The line card 12 is omitted from FIGS. 2-5 to facilitate illustration of the relationships between the magnetic switch 26, the structure 22, and the actuating structure 28. In actual implementation the structure 22 would be associated with the line card 12, for example mounted on the line card 12 or at least electrically coupled to the line card 12.

Figure 6:
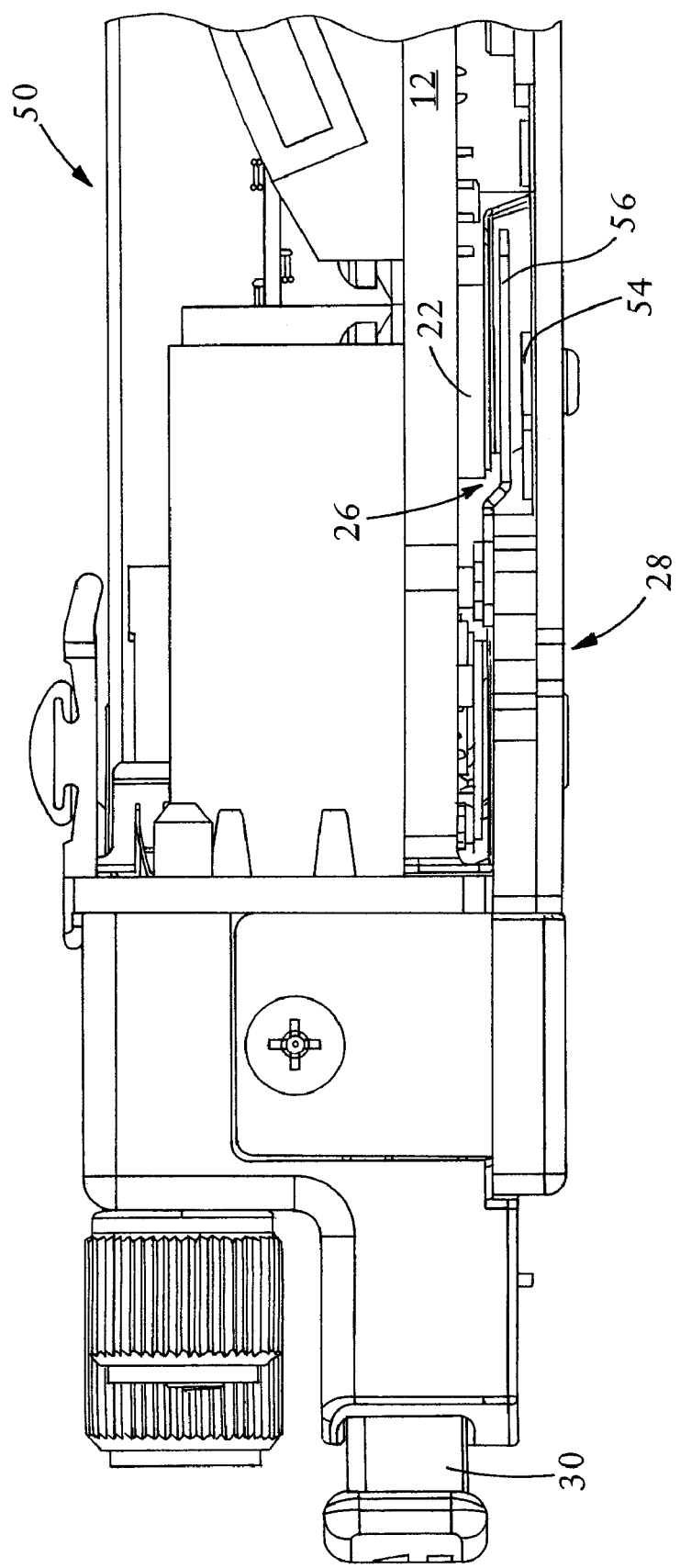
FIG. 6 is a side view of an assembly including the line card, the actuating structure, and the magnetic switch, according to an example embodiment.

FIGS. 2 and 4 illustrate the magnetic switch 26 in a "locked" position 52, and FIGS. 3 and 5 illustrate the magnetic switch 26 in an actuated position 34. As illustrated in FIG. 2, the magnetic switch 26 includes a magnet 54 and a movable magnetic shield 56 (the magnet 54 is obstructed in FIG. 4 by the structure 22). The magnetic shield 56 can be constructed of cold rolled steel, and can be constructed and arranged to block the magnetic field 24 emitted by the magnet 54 to below the second prescribed magnetic flux value. As illustrated in FIGS. 2 and 4, the magnetic shield 56 in the locked position 52 is positioned away from the magnet 54 and the structure 22, enabling the structure 22 to apply a first electrical state (e.g., "OFF") based on the magnetic field 24 applied by the magnet 54 to the structure 22 above the first prescribed magnetic flux value. In contrast, the magnetic shield 56 in the actuated position 34 of FIGS. 3 and 5 is positioned between the magnet 54 in the structure 22, such that the magnetic shield 56 blocks the magnetic field 24 and limits the magnetic field reaching the structure 22 to below the second prescribed magnetic flux value, where the second prescribed magnetic flux value is below the first prescribed magnetic flux value. FIG. 6 illustrates the position of the magnetic shield 56 relative to the magnet 54 and the structure 22. Hence, the magnetic shield 56 can be positioned by the actuating structure 28 in between the magnet 54 and the structure 22 to interrupt the magnetic field 24 detected by the structure 22, causing the structure 22 to detect a transition in the output of the magnetic field 24 from the magnetic shield 56 blocking the magnet 54 and in response transition from the first electrical state (e.g., "OFF") to a second electrical state (e.g., "ON").

The actuating structure 28 can include a first movable structure 30 and a removal arm 32. As illustrated in FIG. 5, the first movable structure 30 (including for example a pushbutton mechanism) can be constructed and arranged for concurrently actuating the magnetic switch 26 to an actuated position 34 as the first movable structure 30 is moved 36 (e.g., a user or other computer-controlled robotic device depressing first movable structure 30), while also moving the removal arm 32 to a first (unlocked) position 38 to initiate removal of the line card 12. In one embodiment, the first movable structure 30, the magnetic switch 26, and the removal arm 32 can be constructed and arranged such that the magnetic switch 26 can be actuated by the first movable structure 30 to the actuated position 34 before the removal arm 32 has completed moving to the first (unlocked) position 38.

The removal arm 32 can be constructed and arranged to enable the network traffic shutdown circuit 20 to complete the shutdown of network traffic prior to the actuating structure 28 permitting complete removal of the line card 12 from the connector chassis 14 and/or the line card assembly 50. In particular, the removal arm 32 can be constructed and arranged to require movement from the first (unlocked) position 38 (illustrated in FIG. 5) to a second (fully extended) position 40 (illustrated in FIG. 1) before the line card 12 can be completely removed from the connector chassis 14. In one embodiment, the first (unlocked) position 38 of FIG. 5 can have an example angle of fifteen (15) degrees between the removal arm 32 and an edge 42 of the line card assembly 50, and the second (fully extended) position 40 of FIG. 1 can have an example angle of fifty-five (55) degrees between the removal arm 32 and the edge 42.

Hence, the actuating structure 28 enables the magnetic switch 26 to automatically initiate shutdown of network traffic before the line card 12 is unlocked at the first (unlocked)

position 38. The movement of the removal arm from the first (unlocked) position 38 to the second (fully extended) position provides sufficient time to ensure the shutdown of network traffic is completed. Hence, shutdown of network traffic can be automatically completed prior to the removal arm 32 being moved to the second (fully extended) position 40 permitting complete removal of the line card 12.

According to the example embodiments, a line card can be reliably disconnected from a connector chassis 14, without adversely affecting other line cards, based on providing a complete and reliable shutdown of network traffic before the line card can be removed from the chassis. The use of magnetic flux from the magnet to initiate shutdown ensures that no power supply is needed to initiate deactivation. Further, the magnetic switch can be hermetically sealed to eliminate contamination and to provide additional reliability, including resistance to electrostatic discharge. Further, the line card 12 can be physically decoupled from the actuating structure 28 and the magnetic switch 26. The line card 12 also can be physically decoupled from the structure 22 if preferred.

While the example embodiments in the present disclosure have been described in connection with what is presently considered to be the best mode for carrying out the subject matter specified in the appended claims, it is to be understood that the example embodiments are only illustrative, and are not to restrict the subject matter specified in the appended claims.

What is claimed is:

1. A method comprising:
   initiating shutdown of network traffic of a line card, while the line card is coupled to a connector chassis and exchanging network traffic, in response to actuation of a magnetic switch associated with the line card, the magnetic switch being actuated to initiate the shutdown in response to movement of actuating structure from a locked position that locks the line card to the connector chassis, the movement of the actuating structure from the locked position to an unlocked position unlocking the line card for removal from the connector chassis; and
   the actuating structure ensuring sufficient time for the shutdown of network traffic in the line card prior to the actuating structure being moved from the unlocked position to a second position permitting complete removal of the line card from the connector chassis.

2. The method of claim 1, wherein the initiating shutdown includes the step of detecting a transition in an output of a magnetic field from the magnetic switch by structure associated with the line card, and initiating the shutdown in response to the transition.

3. The method of claim 2, wherein the detecting includes detecting the transition by a reed switch on the line card and in the structure.

4. The method of claim 3, wherein the magnetic switch includes a magnet and a movable magnetic shield, the initiating shutdown including the step of actuating the magnetic switch based on positioning the movable magnetic shield, by the movement of the actuating structure, to a position that creates the transition in the output of the magnetic field between the magnet and the reed switch.

5. The method of claim 1, wherein the magnetic switch includes a magnet and a movable magnetic shield, the initiating shutdown including the steps of:
   actuating the magnetic switch based on positioning the movable magnetic shield, by the movement of the actuating structure, to a position that creates a transition in an output of a magnetic field between the magnet and structure associated with the line card; and
   initiating the shutdown by the structure in response to detecting the transition.

6. The method of claim 5, wherein the detecting includes detecting the transition by a reed switch in the structure.

7. The method of claim 1, wherein the actuating structure comprises:
   a first movable structure constructed and arranged for actuation of the magnetic switch in response to movement of the first movable structure; and
   a removal arm that is constructed and arranged to be moved to the first position in response to the movement of the first movable structure, the complete removal of the line card based on movement of the removal arm from the first position to the second position.

8. The method of claim 7, wherein the movement of the actuating structure includes a user depressing the first movable structure.

9. The method of claim 7, wherein the magnetic switch is actuated before the removal arm has completed moving to the first position.

10. The method of claim 1, wherein the actuation of the magnetic switch is based on the magnetic switch being mounted on the line card, the movement of the actuating structure being based on the actuating structure being mounted on the line card.

11. An apparatus comprising:
    actuating structure constructed and arranged for movement from a locked position to an unlocked position that unlocks a line card for removal from a connector chassis, the line card exchanging network traffic while coupled to the connector chassis; and
    a magnetic switch constructed and arranged for initiating shutdown of network traffic of the line card in response to the movement of the actuating structure from the locked position that locks the line card to the connector chassis;
    the actuating structure constructed and arranged to ensure sufficient time for the line card to complete the shutdown of network traffic prior to the actuating structure being moved from the unlocked position to a second position permitting complete removal of the line card from the connector chassis.

12. The apparatus of claim 11, further comprising structure associated with the line card and constructed and arranged for detecting a transition in an output of a magnetic field from the magnetic switch, the structure constructed and arranged for initiating the shutdown in response to the transition.

13. The apparatus of claim 12, wherein the structure associated with the line card and detecting the transition includes a reed switch on the line card.

14. The apparatus of claim 13, wherein the magnetic switch includes a magnet and a movable magnetic shield, such that the movement of the actuating structure causes the movable magnetic shield to be positioned to create the transition in the output of the magnetic field between the magnet and the reed switch.

15. The apparatus of claim 11, wherein the magnetic switch includes a magnet and a movable magnetic shield, such that the movement of the actuating structure causes the movable magnetic shield to be positioned to create a transition in an output of a magnetic field between the magnet and a structure associated with the line card, the structure constructed and arranged for initiating the shutdown in response to detecting the transition.

16. The apparatus of claim 15, wherein the structure is a reed switch.

17. The apparatus of claim 11, wherein the actuating structure comprises:
- a first movable structure constructed and arranged for actuation of the magnetic switch in response to movement of the first movable structure; and
- a removal arm that is constructed and arranged to be moved to the first position in response to the movement of the first movable structure, the complete removal of the line card based on movement of the removal arm from the first position to the second position.

18. The apparatus of claim 17, wherein the first movable structure is constructed and arranged to be moved in response to a user depressing the first movable structure.

19. The method of claim 18, wherein the magnetic switch is actuated before the removal arm has completed moving to the first position.

20. The method of claim 11, wherein the magnetic switch and the actuating structure are mounted on the line card.

21. An apparatus comprising:
- means for unlocking a line card for removal from a connector chassis in response to movement of the means for unlocking from a locked position to an unlocked position, the line card exchanging network traffic while coupled to the connector chassis; and
- a magnetic switch constructed and arranged for initiating shutdown of network traffic of the line card in response to the movement of the means for unlocking from the locked position that locks the line card to the connector chassis;
- the means for unlocking further configured for ensuring sufficient time for the line card to complete the shutdown of network traffic prior to the means for unlocking being moved from the unlocked position to a second position permitting complete removal of the line card from the connector chassis.

* * * * *